United States Patent [19]

Ide et al.

[11] 4,406,019

[45] Sep. 20, 1983

[54] SELECTIVITY MEANS IN AMPLITUDE MODULATED RADIO RECEIVERS

[75] Inventors: John D. Ide, Margate; David J. Settlemire, Pompano Beach; Mario C. Novo, Miami, all of Fla.

[73] Assignee: The Bendix Corporation, Southfield, Mich.

[21] Appl. No.: 322,107

[22] Filed: Nov. 16, 1981

[51] Int. Cl.³ ............................................. H04B 1/16
[52] U.S. Cl. ................................... 455/245; 455/266; 455/307; 455/339
[58] Field of Search ............... 455/234, 239, 245, 246, 455/266, 307, 338, 339

[56] References Cited

U.S. PATENT DOCUMENTS

| 3,089,087 | 5/1963 | Birkenes | 455/250 |
| 3,633,119 | 1/1972 | Balbes | 455/339 |
| 3,947,771 | 3/1976 | Mathews et al. | 455/245 |
| 4,030,035 | 6/1977 | Ienaka et al. | 455/246 |
| 4,245,353 | 1/1981 | Bynum | 455/266 |

Primary Examiner—Jin F. Ng
Attorney, Agent, or Firm—W. G. Christoforo; Bruce L. Lamb

[57] ABSTRACT

In an amplitude modulation radio receiver a relatively narrow band filter is placed before the receiver detector and a relatively wide band filter is placed just prior to the IF amplifier stages. An IF stage controlled by receiver AGC is designed to have a saturation or clipping level about 6 dB above the normal IF level for that stage. As a result the selectivity characteristic for the receiver will be approximately rectangular and encompass the IF frequency channel if the bandpass of the narrow band filter is chosen to be the IF frequency channel.

3 Claims, 3 Drawing Figures

SELECTIVITY MEANS IN AMPLITUDE MODULATED RADIO RECEIVERS

BACKGROUND OF THE INVENTION

This invention relates to radio receivers for amplitude modulated (AM) signals and more particularly to AM radio receivers having improved selectivity.

The selectivity of a radio receiver is the characteristic of the receiver which determines the extent to which the receiver is capable of distinguishing between a signal, that is a signal in a channel to which the radio receiver is tuned, and other signals, that is, signals in channels to which the receiver is not tuned, usually signals in channels adjacent to the tuned channel.

The radio frequency spectrum for aircraft radio communications receivers is comprised of a plurality of individual contiguous communications channels, each of which spans an assigned frequency band. In a crowded radio environment, that is, where many of the channels are occupied by active transmitters, it is important that receivers with good selectivity be used to avoid interference from adjacent channel signals into the channel to which a particular receiver is tuned.

The conventional approaches to obtaining desired selectivity in AM radio receivers include the use of multiple tuned IF or RF circuits or the use of a single, multiple element crystal or ceramic filter to provide the required frequency selection. However, as channel spacings in the AM radio frequency spectrum decrease in response to the demand to increase the number of channels in a given spectrum band, the selectivity requirements to which receivers are designed become increasingly more difficult to achieve with the conventional design approaches. More specifically, the conventional elements used to provide selectivity have a response versus frequency characteristic which includes a pass-band at the desired channel and trailing skirts at either side thereof. When the next lower channel and next higher channel are moved closer to the desired channel to make more room in the AM spectrum for additional channels, these adjacent channels move into the skirts of the selectivity characteristic. This, of course, will cause adjacent channel interference in the tuned or desired channel. It is thus important, to avoid such adjacent channel interference, to redesign the selectivity element to provide more sharply trailing skirts in its selectivity characteristic.

SUMMARY OF THE INVENTION

The present invention provides a selectivity element having a selectivity characteristic having sharply trailing skirts or, in other words, an essentially rectangular characteristic which encompasses the desired or tuned channel. This is accomplished through the use of two frequency filters, each of which exhibits a conventional characteristic in that each individually has a pass-band and gradually trailing skirts. One such filter has a wider pass-band than the other, and more particularly, the pass-band of the narrower band filter is chosen to be equal to the width of the channel. The filters are placed in the IF section of the receiver, the relatively wider band filter being placed prior to an IF amplifier and the narrower band filter after the IF amplifier. An AGC feedback circuit is connected around the narrower band filter to increase the gain of the above mentioned amplifier when the output from the narrower band filter decreases. The IF stages prior to the narrower band filter are designed to have an overload or clipping threshold about 6 dB above the normal signal level for that stage. Thus, for signals outside the pass-band of the narrow band filter but inside the pass-band of the wide band filter, the feedback circuit will cause the gain of the IF stages to increase and saturate to thus clip the amplitude modulation from the IF carrier. This effectively eliminates any adjacent channel interference by providing an essentially rectangular response of the filters in combination with the feedback circuit.

The main advantage of the invention is that it provides improved selectivity in an AM radio receiver by eliminating adjacent channel interference.

BRIEF DESCRIPTION OF THE DRAWINGS

In FIG. 2 the skirts of the individual filters are alike.

DESCRIPTION OF THE PREFERRED EMBODIMENT

Figure 1:
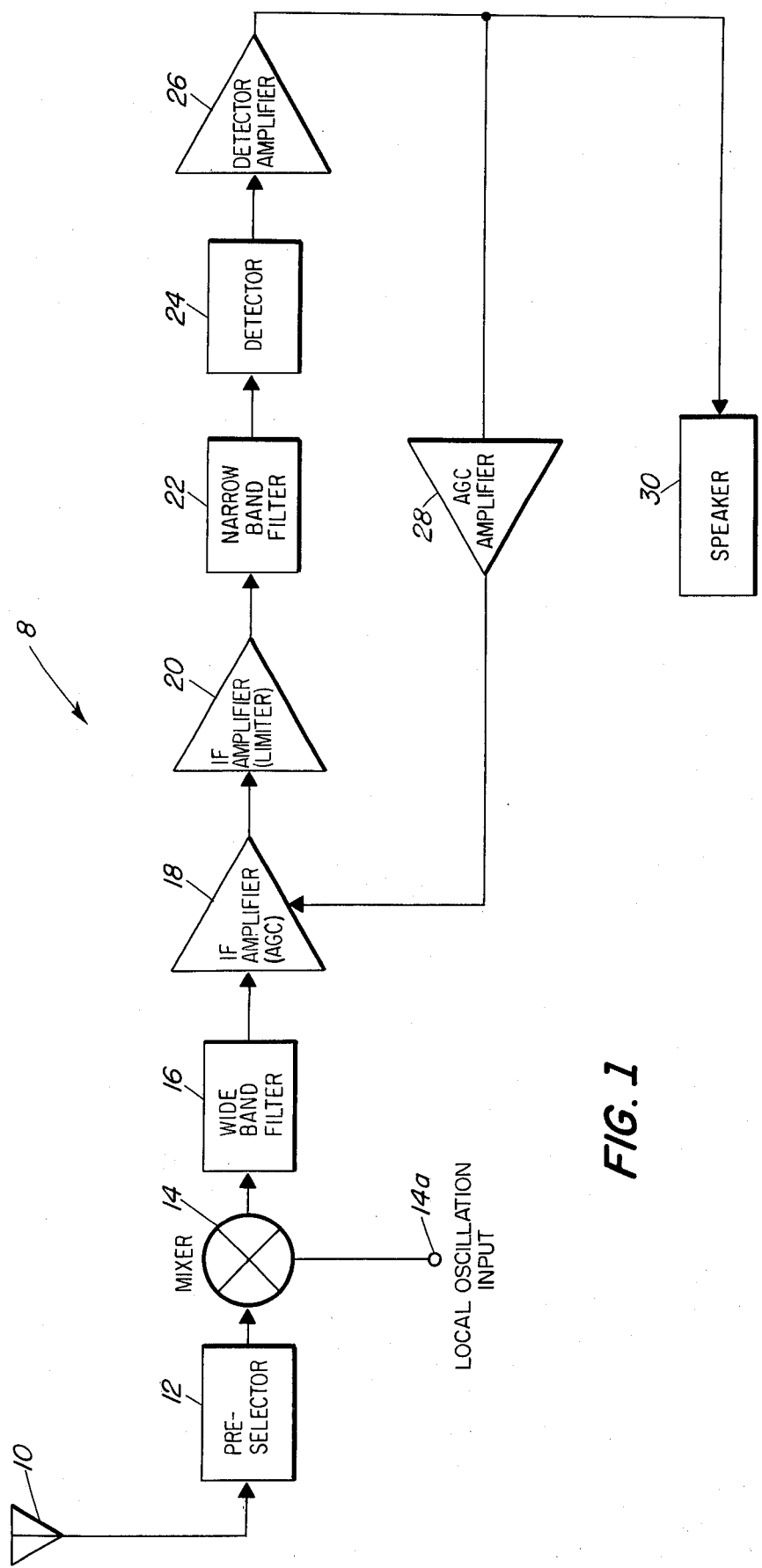
FIG. 1 is a block diagram of an embodiment of the invention.

Refer to FIG. 1 where the invention is shown embodied in an avionics type communication transceiver, and more particularly, in the receiver portion 8 thereof. The elements shown are conventional for a single conversion AM receiver except for the insertion of an additional filter 22 and the possible modification of filter 16 and amplifier 18 to provide the desired improved selectivity. Specifically, a desired radio signal $f_r$ received at antenna 10 is coupled to mixer 14 by a preselector 12. In mixer 14 the desired frequency $f_r$ is combined with the local oscillator frequency $f_{LO}$ received at terminal 14$a$ from a tuneable local oscillator (not shown) to produce a mixer output comprised generally of frequencies $f_U$ and $f_L$ where:

$$f_U = f_r + f_{LO}$$

and $$f_L = f_r - f_{LO}.$$

In this embodiment the difference frequency is selected and referred to as the intermediate or IF frequency. The IF frequency is applied to a pass-band filter 16 which is here termed a wide band filter in that its effective pass-band is wider than the bandwidth of one channel. As known to those skilled in the art, this filter in a prior art single conversion AM receiver not using the present invention would have a pass-band about equal to the bandwidth of one channel. It should also be noted, as will be explained below, that filter 16 has the conventional wide trailing skirts of the prior art filters.

The IF signal passed by filter 16 is amplified in turn by AGC/IF amplifier 18 and IF limiting amplifier 20. The resulting amplified IF signal is applied to a second filter 22, which is here termed a narrow band filter in the sense that its pass-band is narrower than the pass-band of filter 16 and, specifically, has an effective pass-band equal to the pass-band of one channel. The signal from filter 22 is detected by detector 24 and the resulting audio signal is amplified by amplifier 26 and applied to speaker for transduction into audible sound in the conventional manner.

The amplified detector output is also applied to automatic gain control (AGC) loop amplifier 28 with the resulting AGC signal being used to control the gain of IF/AGC amplifier 18. Amplifier 20 is designed to have a clipping level in response to the signal from amplifier 28 about 6 dB above the normal signal level in that element, the reason for which will be made clear below.

The operation of the circuit of FIG. 1 can be explained with reference to FIG. 2 where 16a/16a, shown in broken line, are the trailing skirts of the idealized selectively characteristic of a typical filter 16 of FIG. 1, 22a/22a are the trailing skirts of the idealized selectivity characteristic of a typical filter 22 of FIG. 1 and 38a/38a are the trailing skirts of the idealized selectivity characteristic of a composite filter comprised of filters 16 and 22 connected serially. It should be understood that, with respect to FIGS. 2 and 3, the curves shown, being idealized, are illustrated as segmented straight lines. The actual selectivity curves would be a composite of approximate bell-shaped curves with the number of peaks in the passband, that is, between $f_1$ and $f_2$, being equal to the number of filter poles. In any event, the selectivity characteristics of FIGS. 2 and 3 closely resemble the actual selectivity characteristics and simplify an understanding of the invention. Returning to FIG. 2, the desired channel 40, which is the channel to which the radio receiver is tuned, is between frequencies $f_1$ and $f_2$. The adjacent channels are designated 42 and 44. As can be seen, the 3 dB bandwidth of filter 22 extends generally from frequency $f_1$ to frequency $f_2$. The 3 dB bandwidth of filter 16 extends generally from frequency $f_3$ to $f_4$ where generally:

$$f_1 - f_3 = f_4 - f_2.$$

It can also be seen that the trailing skirts of the selectivity characteristic of the usual filter, such as filter 22 of FIG. 1, extend into the adjacent channels 42 and 44 and may thus cause some adjacent channel interference. Even the composite filter comprised of filters 16 and 22 connected in series to have an improved selectivity characteristic such as 38a/38a will permit some interference from adjacent channels. On the other hand, the present invention provides a selectivity characteristic 46/46 which provides sharp cut-off at the boundaries $f_1$ and $f_2$ of the desired channels. This is accomplished as follows. With reference also to FIG. 1, for an input signal at antenna 10 which produces an IF within the frequency band extending from $f_1$ to $f_2$, receiver 8 and its AGC elements 18 and 28 generally operate normally, that is, the output of audio amplifier 26 will remain at a constant amplitude, except of course for the standard audio content thereof, for varying input signal levels, due to the action of the AGC elements. For input signals which produce IF signals which fall in the $f_3$ to $f_1$ or $f_2$ to $f_4$ frequency ranges, however, since the level of the signal driving detector 24 tends to fall in response to the decreasing output signal level from filter 22, the level of the signals driving detector amplifier 26 and hence AGC amplifier 28 will also fall, thus causing amplifier 28 to drive IF amplifier 18 to increase gain to maintain appropriate signal levels within the receiver constant. However, the input to IF amplifier 18 from filter 16 will not decrease for input signals producing an IF which lie between $f_3$ and $f_1$ or $f_2$ and $f_4$ (FIG. 2) because of the wider selectivity characteristic of filter 16, which has a flat section lying between $f_3$ and $f_4$. Remembering that IF amplifier 20 is designed to saturate at signal levels 6 dB above the normal signal level, amplifier 20 will saturate or limit and thus remove or clip any amplitude modulation carried on IF in the frequency ranges of $f_3$ to $f_1$ and $f_2$ to $f_4$ so that detector 24 output for any amplitude modulation carried at the above mentioned IF frequency ranges is very low or zero. For IF signals having a frequency less than $f_3$ and greater than $f_4$ a like process continues since the attenuation of signals by filter 16 is relatively less than signals by filter 22 so that amplifier 18 continues to saturate and clip the undesired amplitude modulation from the IF carrier outside the $f_1$-$f_2$ frequency range.

Figure 2:
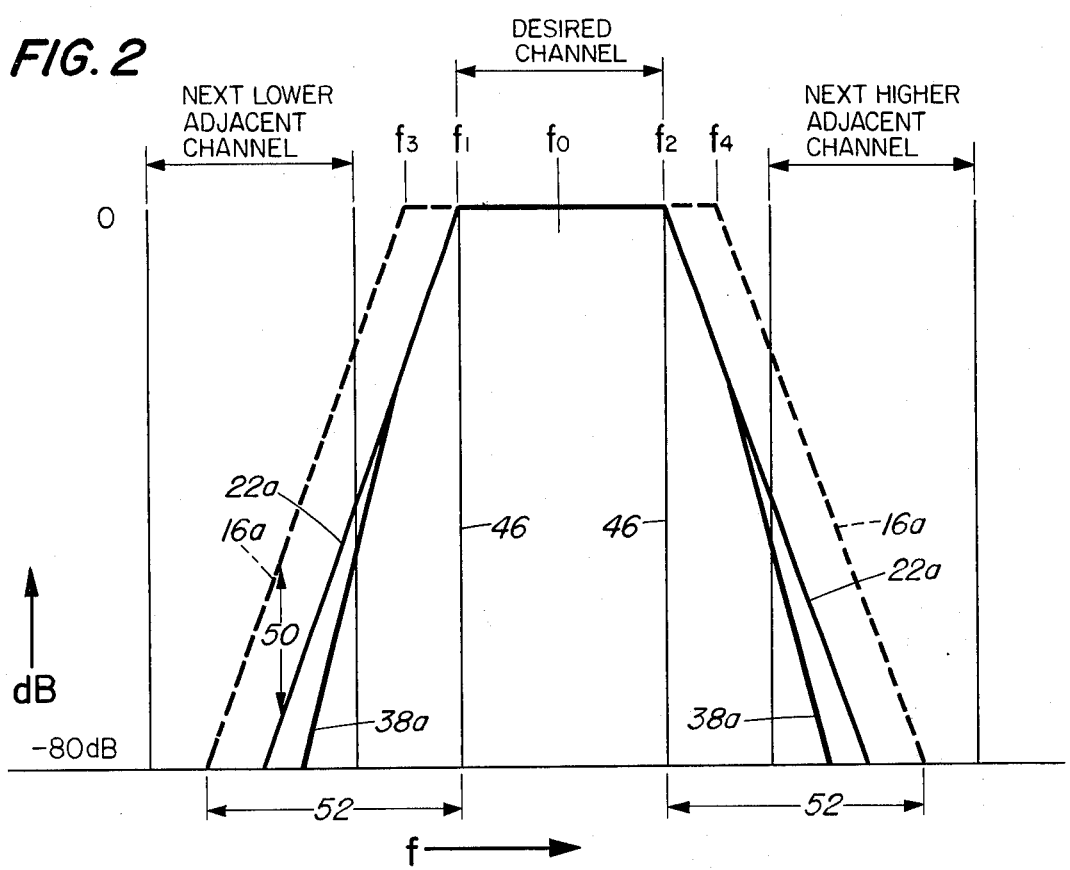
FIG. 2 shows typical idealized characteristic responses of the filters with and without the feedback circuit and aids in explaining the principles of the invention.

The scope of the present invention is not limited to filters having the ideally overlapping filter responses of FIG. 2 but generally includes any overlapping filter responses that result in saturation or clipping of a gain stage, thereby removing amplitude modulation on carriers outside the desired band-pass. Practice of the invention requires at least two filters, a relatively narrower band filter preceding the detector where the receiver minimum nose (or passband) bandwidth is determined by this filter, and a relatively wider band filter which precedes an AGC element of the receiver IF section. An IF stage prior to the narrower band filter must have an overload or clipping threshold about 6 dB above the normal signal level in the stage in response to the AGC signal. The differences in the magnitudes of the amplitude responses at any frequency in the rejection bands must be greater than the difference between the normal signal level and the overload or clipping threshold of the above mentioned IF stage minus the gain in the AGC loop. For most AM receivers a magnitude difference of about 1 dB is sufficient for excellent rejection of adjacent channel interference since AGC loops are usually high gain systems. With reference to FIG. 2, the above mentioned magnitude difference is designated as 50. The rejection band over which the magnitude difference is effective is designated as 52/52.

Figure 3:
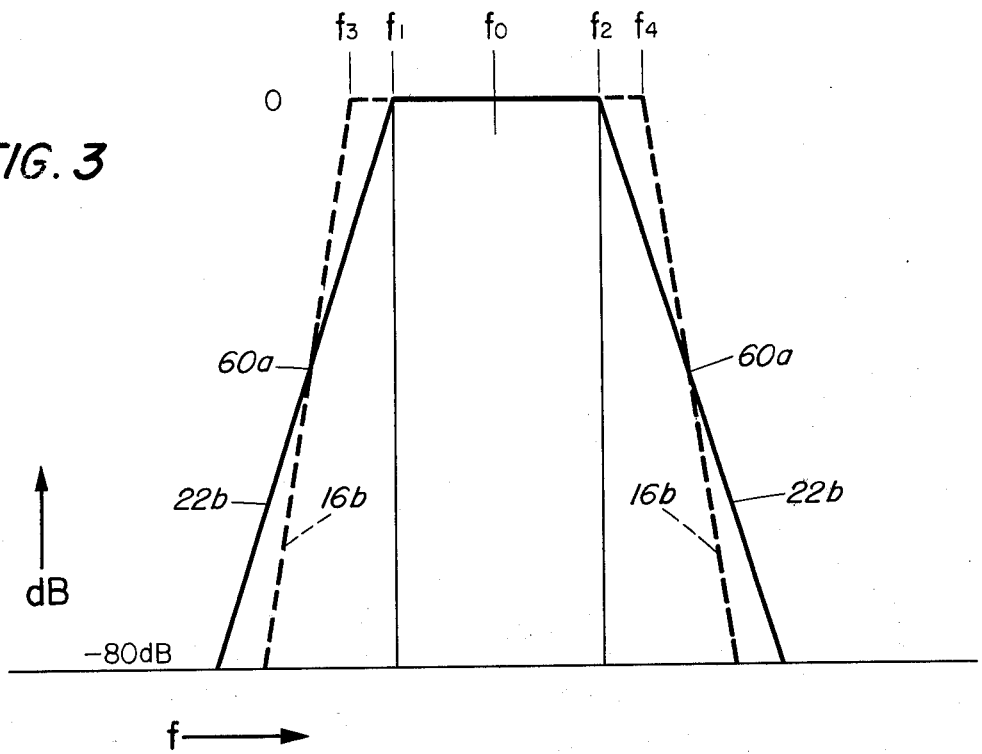
FIG. 3 is similar to FIG. 2 except the skirts of the individual filters differ from one another.

Refer now to FIG. 3 where the skirts of the selectivity characteristics or responses 16b/16b and 22b/22b respectively of filters 16 and 22 of FIG. 1 are not parallel to one another but rather intersect at points 60a and 60b. As known to those skilled in the art, this indicates that the various filters do not have the same number of poles. In the example, filter 16 is assumed to be an 8-pole filter and filter 22 a 6-pole filter. In this example, the invention as described above is effective only in the frequency range from point 60a to $f_1$ and $f_2$ to point 60b. As known to those skilled in the art, at frequencies far removed from the desired channel center frequency $f_0$, such as frequencies below point 60a and above point 60b, the filters operating individually will attenuate any adjacent channel interference sufficiently to reduce such interference to a low level. Thus the receiver signal-to-noise ratio will be sufficiently low to permit the receiver squelch circuit to eliminate any adjacent channel interference so that the apparent receiver selectivity response will be approximately rectangular as before.

It should thus be understood that the invention is not to be limited to the case of ideally overlapping filter responses as depicted in FIG. 2 but includes any overlapping filter responses that result in the saturation or clipping of a gain stage, thereby removing the undesired modulation at frequencies outside the desired band-pass. It should also now be possible for one skilled in the art to design modifications and alterations of the invention described above. Accordingly, the invention is to be limited to the true spirit and scope of the appended claims.

The invention claimed is:

1. In a superheterodyne type receiver for amplitude modulated radio signals, said receiver including mixer and tunable local oscillator stages for converting to intermediate frequency signals appearing on a selected frequency channel from amongst a plurality of frequency channels within the receiver operating band, said receiver further including a variable gain intermediate frequency amplifier for amplifying said converted signals, a detector for said amplified intermediate frequency signals and an automatic gain control amplifier for controlling the gain of said intermediate frequency amplifier;

improved means for preventing detection of signals by said receiver whenever the frequency of such signals is within a frequency channel adjacent to the selected frequency channel of said receiver, comprising, a relatively wide band filter to which frequency converted signals from said mixer stage are applied and from which signals are applied as inputs to said intermediate frequency amplifier, said wide band filter having an attenuation v. frequency characteristic which is substantially flat from a first frequency below the lowest intermediate frequency of said receiver to a second frequency above the highest intermediate frequency of said receiver and having a lower skirt sloping from said first frequency toward frequencies lower than said first frequency to define increasing attenuation with decreasing frequency and having an upper skirt sloping from said second frequency toward frequencies higher than said second frequency to define increasing attenuation with increasing frequency;

a relatively narrow band filter to which signals amplified by said intermediate frequency are applied and from which signals are applied as inputs to said detector, said narrow band filter having an attenuation v. frequency characteristic which is substantially flat from the lowest intermediate frequency of said receiver to the highest intermediate frequency of said receiver and having a lower skirt sloping from said lower intermediate frequency toward frequencies lower than said lowest intermediate frequency to define increasing attenuation with decreasing frequency and having an upper skirt sloping from said highest intermediate frequency toward higher frequencies to define increasing attenuation with increasing frequency;

means for applying the output of said detector to said automatic gain control amplifier for controlling the gain of said intermediate frequency amplifier, said automatic gain control amplifier being adjusted to increase the gain of said intermediate frequency amplifier to saturation whenever an interfering signal is present at the input to said wide band filter, said interfering signal having a frequency such that said wide band filter affords less attenuation at such frequency than he attenuation afforded by said narrow band filter at such frequency.

2. A receiver as claimed in claim 1 wherein said lower and said upper skirts of the attenuation v. frequency characteristic of said narrow band filter are substantially parallel, respectively, to said lower and said upper skirts of said wide band filter attenuation v. frequency characteristic.

3. A receiver as claimed in claim 1 wherein said lower and said upper skirts of the attenuation v. frequency characteristic of said wide band filter have a greater slope than said lower and said upper skirts of said narrow band filter attenuation v. frequency characteristic whereby said lower skirts and said upper skirts of both said filters intersect, respectively, at a frequency lower than said lowest intermediate frequency and at a frequency higher than said highest intermediate frequency.

* * * * *